United States Patent
Kamei et al.

(10) Patent No.: US 8,030,576 B2
(45) Date of Patent: Oct. 4, 2011

(54) WIRED CIRCUIT BOARD WITH INTERPOSED METAL THIN FILM AND PRODUCING METHOD THEREOF

(75) Inventors: Katsutoshi Kamei, Osaka (JP); Takahiko Yokai, Osaka (JP); Visit Thaveeprungsriporn, Osaka (JP)

(73) Assignee: Nitto Denko Corporation, Osaka (JP)

( * ) Notice: Subject to any disclaimer, the term of this patent is extended or adjusted under 35 U.S.C. 154(b) by 868 days.

(21) Appl. No.: 12/073,193

(22) Filed: Mar. 3, 2008

(65) Prior Publication Data

US 2008/0217048 A1 Sep. 11, 2008

Related U.S. Application Data

(60) Provisional application No. 60/907,018, filed on Mar. 16, 2007.

(30) Foreign Application Priority Data

Mar. 5, 2007 (JP) .................. 2007-054339

(51) Int. Cl.
*H05K 1/03* (2006.01)
*G11B 5/48* (2006.01)
*G11B 21/16* (2006.01)

(52) U.S. Cl. .................... 174/255; 360/245.9
(58) Field of Classification Search .......... 174/254, 174/255, 256, 258, 265, 260, 261; 360/245.9; 361/767, 772
See application file for complete search history.

(56) References Cited

U.S. PATENT DOCUMENTS

| | | |
|---|---|---|
| 5,858,518 A | 1/1999 | Omote et al. |
| 6,096,482 A | 8/2000 | Omote et al. |
| 6,100,582 A | 8/2000 | Omote et al. |
| 6,198,052 B1 * | 3/2001 | Omote et al. ............ 174/261 |
| 2001/0051707 A1 | 12/2001 | Fukuoka |
| 2003/0013236 A1 | 1/2003 | Nakata et al. |
| 2005/0061542 A1 | 3/2005 | Aonuma et al. |
| 2006/0049516 A1 * | 3/2006 | Wang et al. ............ 257/734 |

FOREIGN PATENT DOCUMENTS

| | | |
|---|---|---|
| CN | 1236290 A | 11/1999 |
| CN | 1397830 A | 2/2003 |
| JP | 03-126291 | 5/1991 |
| JP | 03-268385 | 11/1991 |
| JP | 05-235494 | 9/1993 |
| JP | 10-12983 | 1/1998 |
| JP | 2002-111205 | 4/2002 |
| JP | 2005-100488 | 4/2005 |

* cited by examiner

*Primary Examiner* — Timothy Thompson
*Assistant Examiner* — Roshn Varghese
(74) *Attorney, Agent, or Firm* — Jean C. Edwards, Esq.; Edwards Neils PLLC

(57) ABSTRACT

A wired circuit board includes an insulating base layer, a conductive pattern formed on the insulating base layer and including a wire and a terminal portion, an insulating cover layer formed on the insulating base layer and having an opening portion to expose the terminal portion, and a metal thin film including a protecting portion interposed between the wire and the insulating cover layer, and an exposed portion formed continuously from the protecting portion on a peripheral end portion of the terminal portion exposed from the opening portion.

4 Claims, 5 Drawing Sheets

PRIOR ART

WIRED CIRCUIT BOARD WITH INTERPOSED METAL THIN FILM AND PRODUCING METHOD THEREOF

CROSS REFERENCE TO RELATED APPLICATION

This application claims the benefit of U.S. Provisional Application No. 60/907,018, filed Mar. 16, 2007, and claims priority from Japanese Patent Application No. 2007-54339, filed Mar. 5, 2007, the contents of which are herein incorporated by reference in their entirety.

BACKGROUND OF THE INVENTION

1. Field of the Invention

The present invention relates to a wired circuit board and a producing method thereof and, more particularly, to a wired circuit board such as a flexible wired circuit board or a suspension board with circuit and a producing method thereof.

2. Description of the Related Art

A wired circuit board such as a flexible wired circuit board or a suspension board with circuit includes, e.g., an insulating base layer made of a polyimide resin or the like, a conductive layer formed on the insulating base layer, made of copper or the like, and including wires and terminal portions, and an insulating cover layer formed on the insulating base layer and made of a polyimide resin or the like to cover the conductive layer. Such a wired circuit board is widely used in the field of various electric and electronic equipment.

For the purpose of preventing migration in a conductive layer, a suspension board with circuit 31 as shown in FIG. 5(a) is proposed as such a wired circuit board, in which, e.g., a nickel thin film 35 is formed on the surface of a copper conductive layer 34 formed on an insulating layer 33 supported by a stainless steel foil base material 32 to cover and protect the surface of the copper conductive layer 34 (see, e.g., Japanese Unexamined Patent No. 10 129831 10-12983).

In the production of the suspension board with circuit 31 described in Japanese Unexamined Patent No. 10-12983, the nickel thin film 35 formed on the surface of a terminal portion 38 exposed from an opening portion 41 in an insulating cover layer 36 is removed by etching using the insulating cover layer 36 as an etching resist, and then a terminal is formed on the surface of the terminal portion 38 by electrolytic plating.

SUMMARY OF THE INVENTION

However, when etching is performed using the insulating cover layer 36 as an etching resist, there may be a case where the nickel thin film 35 covered with the insulating cover layer 36 is over-etched around the opening portion 41, as shown in FIG. 5(b). In such a case, a gap (space) 40 is formed between the insulating cover layer 36 and the copper conductive layer 34 and around the opening portion 41. As a result, when the terminal is formed in the opening portion 41 by dipping the suspension board with circuit 31 in an electrolytic plating solution after the etching, the electrolytic plating solution enters and remains in the gap 40. This causes problems of corrosion and discoloration of the copper conductive layer 34.

An object of the present invention is to provide a wired circuit board which prevents corrosion and discoloration of a conductive pattern while preventing migration in a conductive pattern, and a producing method thereof.

A wired circuit board of the present invention comprises an insulating base layer, a conductive pattern formed on the insulating base layer and including a wire and a terminal portion, an insulating cover layer formed on the insulating base layer and having an opening portion to expose the terminal portion, and a metal thin film including a protecting portion interposed between the wire and the insulating cover layer, and an exposed portion formed continuously from the protecting portion on a peripheral end portion of the terminal portion exposed from the opening portion.

Further, in the wired-circuit board of the present invention, it is preferable that the metal thin film is made of nickel.

In the wired circuit board of the present invention, it is preferable that the wired circuit board of the present invention further comprises a plating layer formed in the opening portion.

In the wired circuit board of the present invention, the exposed portion formed continuously from the protecting portion is formed on the peripheral end portion of the terminal portion exposed from the opening portion. In other words, the protecting portion and the exposed portion are continuously formed between the insulating cover layer and the conductive pattern around the opening portion. As a result, when the plating layer is formed, it is possible to prevent a plating solution or the like from entering the space between the insulating cover layer and the conductive pattern around the opening portion. Consequently, this prevents corrosion and discoloration of the terminal portion by means of the metal thin film while preventing migration in the conductive pattern.

A producing method of a wired circuit board of the present invention comprises the steps of preparing an insulating base layer, forming a conductive pattern including a wire and a terminal portion on the insulating base layer, covering the conductive pattern with a metal thin film, forming an insulating cover layer having an opening portion to expose the terminal portion on the metal thin film, forming an etching resist on the metal thin film on a peripheral end portion of the terminal portion exposed from the opening portion, removing the metal thin film exposed from the etching resist in the terminal portion by etching, and removing the etching resist.

Further, in the producing method of the wired circuit board of the present invention, it is preferable that the metal thin film is made of nickel.

In the producing method of the wired circuit board of the present invention, it is preferable that the producing method of the wired circuit board of the present invention further comprises a step of forming a plating layer in the opening portion.

In accordance with the producing method of a wired circuit board of the present invention, the metal thin film on the terminal portion exposed from the opening portion is removed by etching, while protecting the metal thin film on the peripheral end portion of the terminal portion exposed from the opening portion with the etching resist. As a result, the exposed portion formed continuously from the protecting portion can be formed easily and reliably on the peripheral end portion of the terminal portion exposed from the opening portion. This prevents of corrosion and discoloration of the terminal portion by means of the metal thin film while preventing migration in the conductive pattern.

DETAILED DESCRIPTION OF THE INVENTION

Figure 1:
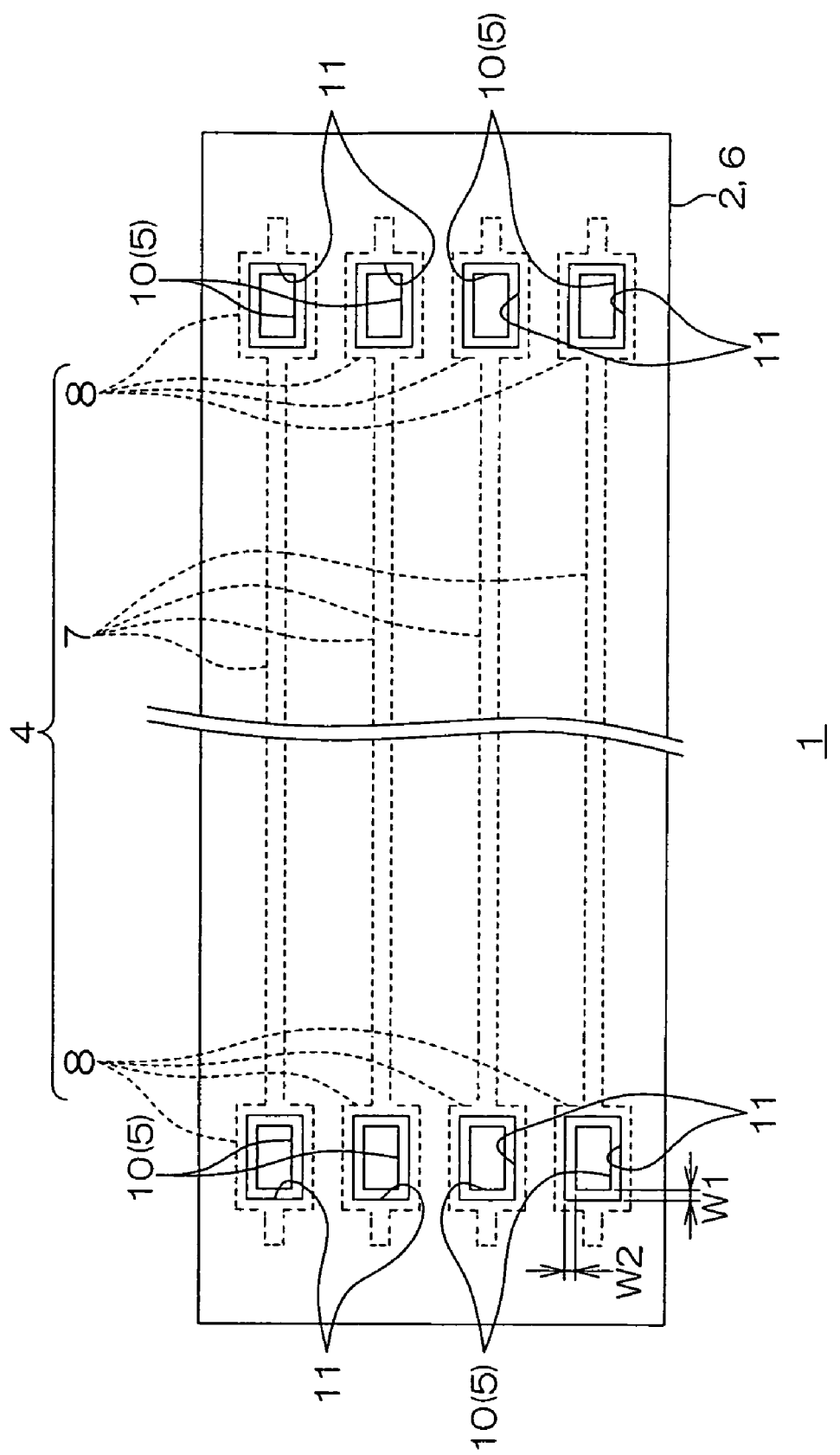
FIG. 1 is a schematic plan view showing an embodiment of a wired circuit board of the present invention.
Figure 2:
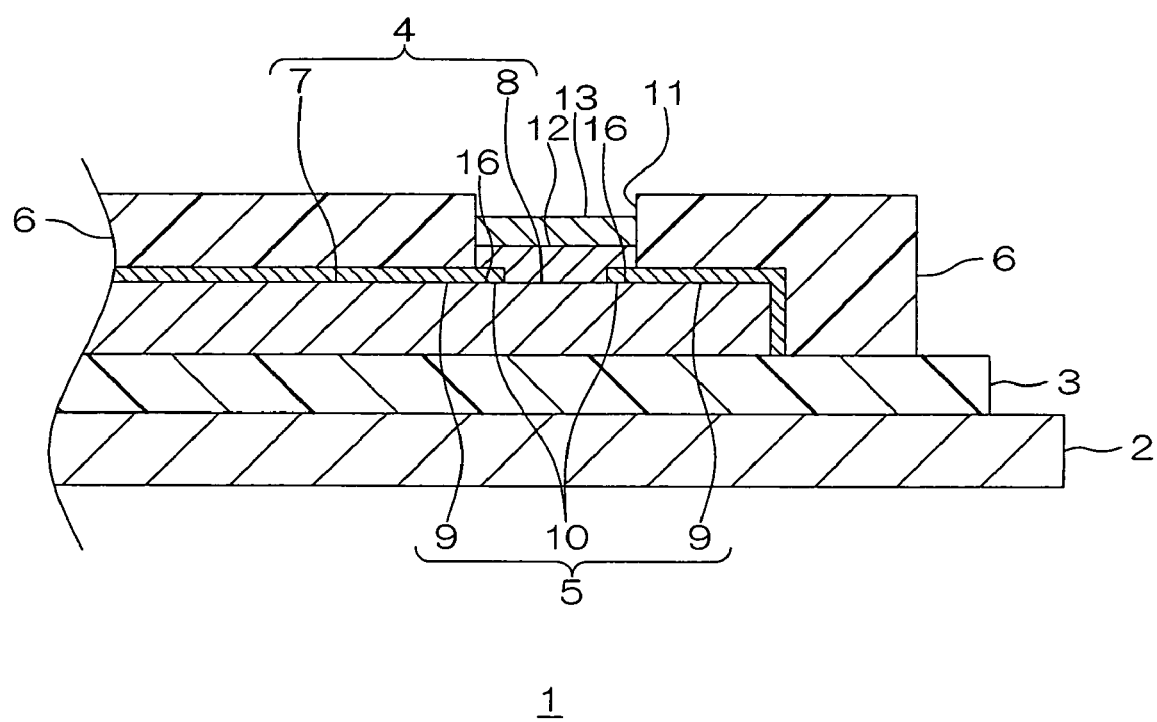
FIG. 2 is a partial cross-sectional view in the longitudinal direction of the wired circuit board shown in FIG. 1.

FIG. 1 is a schematic plan view showing an embodiment of a wired circuit board according to the present invention. FIG. 2 is a partial cross-sectional view in the longitudinal direction of the wired circuit board shown in FIG. 1. In FIG. 1, an insulating base layer 3, a nickel plating layer 12, and a gold plating layer 13, each described later, are omitted for clear illustration of a relative position of a conductive pattern 4 and a cover opening portion 11.

In FIG. 1, the wired circuit board 1 is a wired circuit board such as a flexible wired circuit board or a suspension board with circuit. As shown in FIG. 2, the wired circuit board 1 includes a metal supporting board 2, the insulating base layer 3 formed on the metal supporting board 2, the conductive pattern 4 formed on the insulating base layer 3, and an insulating cover layer 6 formed on the insulating base layer 3.

The metal supporting board 2 is provided as a reinforcing layer when the wired circuit board 1 is, e.g., a flexible wired circuit board. When the wired circuit board 1 is a suspension board with circuit, the metal supporting board 2 is provided as a supporting board (suspension board) for supporting a magnetic head (not shown) mounted thereon. The metal supporting board 2 is formed of a thin plate in the shape of a flat plate. When the metal supporting board 2 is formed as the reinforcing layer, it is provided locally at portions where the reinforcing layer is needed. When the metal supporting board 2 is formed as the supporting board, it is formed to correspond to the outer shape of the wired circuit board 1.

The length (longitudinal length) and width (widthwise length) of the metal supporting board 2 are selected appropriately depending on the purpose and application.

The insulating base layer 3 is formed on the metal supporting board 2 to have a pattern corresponding to a portion where the conductive pattern 4 is formed.

The length and width of the insulating base layer 3 is selected appropriately to have the shape described above depending on the purpose and application.

As shown in FIG. 1, the conductive pattern 4 is formed as a wired circuit pattern integrally and continuously including wires 7 and terminal portions 8 connected to the wires 7.

The plurality of wires 7 are provided along the longitudinal direction of the wired circuit board 1 and arranged in mutually spaced-apart and parallel relation in a widthwise direction (perpendicular to the longitudinal direction and hereinafter referred to as such).

The terminal portions 8 are disposed at the both longitudinal ends of the wired circuit board 1 and provided in parallel as wide quadrilateral lands each having a generally rectangular shape when viewed in plan view such that the both ends of the individual wires 7 are connected thereto.

The width of each of the wires 7 is in the range of, e.g., 10 to 100 µm, or preferably 15 to 50 µm. The spacing between the individual wires 7 is in the range of, e.g., 10 to 100 µm, or preferably 15 to 50 µm.

The width of each of the terminal portions 8 is in the range of, e.g., 50 to 1000 µm, or preferably 80 to 500 µm. The length of each of the terminal portions 8 is in the range of, e.g., 10 to 1000 µm, or preferably 100 to 500 µm. The spacing (length of the interval between the individual terminal portions 8 adjacently arranged in the widthwise direction) between the individual terminal portions 8 is in the range of, e.g., 50 to 1000 µm, or preferably 80 to 500 µm.

As shown in FIG. 2, the insulating cover layer 6 is formed over the insulating base layer 3 and the conductive pattern 4. The insulating cover layer 6 is formed with cover opening portions 11 extending therethrough in the thickness direction to correspond to the respective terminals 8. As shown in FIG. 1, each of the cover opening portions 11 is formed to have a shape similar to and slightly smaller than the terminal portions 8 when viewed in plan view. As a result, the peripheral end portions of the terminal portions 8 are covered with the insulating cover layer 6 and the inner portions of the peripheral end portions of the terminal portion 8 are exposed from the cover opening portions 11.

The length and width of the insulating cover layer 6 is selected appropriately to have the shape described above depending on the purpose and application.

In the wired circuit board 1, as shown in FIG. 2, a nickel plating layer 12 and a gold plating layer 13, each as a plating layer, are successively formed on the terminal portions 8 in the cover opening portions 11.

In addition, the wired circuit board 1 includes a metal thin film 5 for covering and protecting the wires 7.

The metal thin film 5 integrally includes protecting portions 9 and exposed portions 10.

The protecting portions 9 are formed on the surface of the conductive pattern 4 covered with the insulating cover layer 6. That is, the protecting portions 9 are interposed between the wires 7 and the insulating cover layer 6. More specifically, the protecting portions 9 are formed on the upper surfaces, both widthwise side surfaces, and both longitudinal side surfaces of the wires 7.

The exposed portions 10 are formed on the peripheral end portions (inner portions of the peripheral end or edge portions of the terminal portions 8 mentioned above) 16 of the terminal portions 8 exposed from the cover opening portions 11, as shown in FIGS. 1 and 2. The exposed portions 10 are formed continuously from the protecting portions 9 so as to protrude from the protecting portions 9 into the cover opening portions 11 of the insulating cover layer 6. The exposed portions 10 are interposed between the peripheral end portions 16 of the terminal portions 8 exposed from the cover opening portions 11 and the peripheral end portions of the nickel plating layer 12.

As shown in FIG. 1, the width W1 in the longitudinal direction of the exposed portion 10, i.e., the length W1 between the longitudinal end edge of the cover opening portion 11 and the longitudinal end edge of the exposed portion 10 and the width (see FIG. 1) W2 in the widthwise direction of the exposed portion 10, i.e., the length W2 between the widthwise end edge of the cover opening portion 11 and the widthwise end edge of the exposed portion 10 may be either the same or different from each other. For example, the width W1 and the width W2 is not less than 1 μm, or preferably not less than 5 μm, and, e.g., not more than 50 μm, or preferably not more than 35 μm.

When the width W1 in the longitudinal direction of the exposed portion 10 or the width W2 in the widthwise direction thereof is over the range shown above, mounting may be affected thereby. On the other hand, when the width W1 or the width W2 is under the range shown above, there may be a case where the protecting portions 10 are removed by over-etching in the etching of the metal thin film 5.

Figure 3:
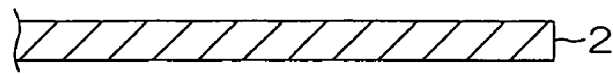
FIG. 3 is a partial cross-sectional view in the longitudinal direction showing the process steps of producing the wired circuit board shown in FIG. 2, (a) showing the step of preparing a metal supporting board, (b) showing the step of forming an insulating base layer on the metal supporting board, (c) showing the step of forming a conductive pattern on the insulating base layer, (d) showing the step of covering the conductive pattern with a metal thin film, and (e) showing the step of forming an insulating cover layer in a pattern formed with cover opening portions on the insulating base layer and the metal thin film.
Figure 3:
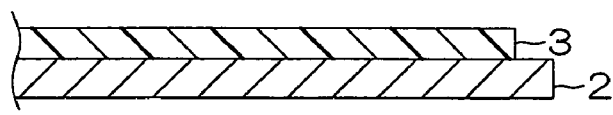
Figure 3:
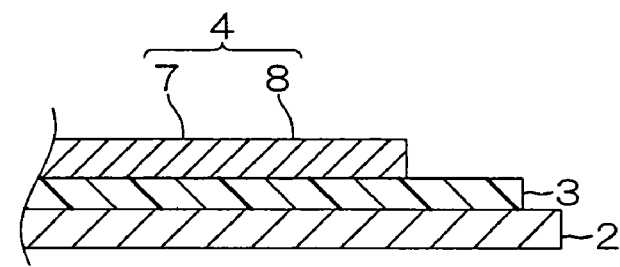
Figure 3:
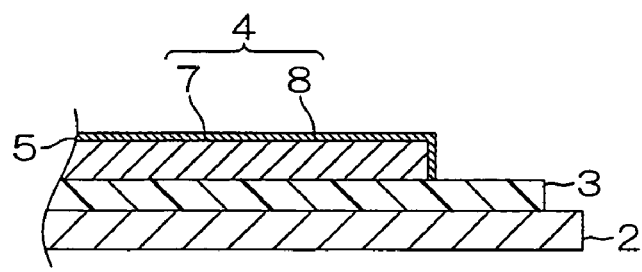
Figure 3:
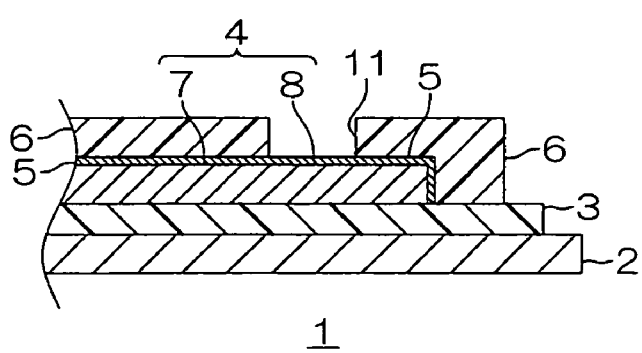
Figure 4:
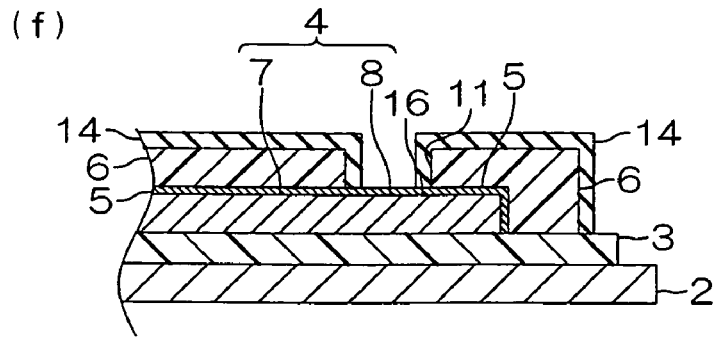
FIG. 4 is a partial cross-sectional view in the longitudinal direction showing the process steps of producing the wired circuit board shown in FIG. 2, subsequently to FIG. 3, (f) showing the step of forming an etching resist on the metal thin film on the peripheral end portions of terminal portions exposed from cover opening portions, (g) showing the step of etching the metal thin film exposed from the etching resist, (h) showing the step of removing the etching resist, and (i) showing the step of forming a nickel plating layer and a gold plating layer in the cover opening portions.
Figure 4:
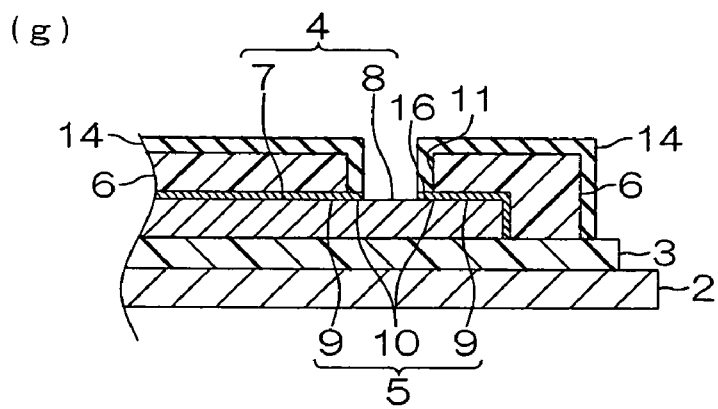
Figure 4:
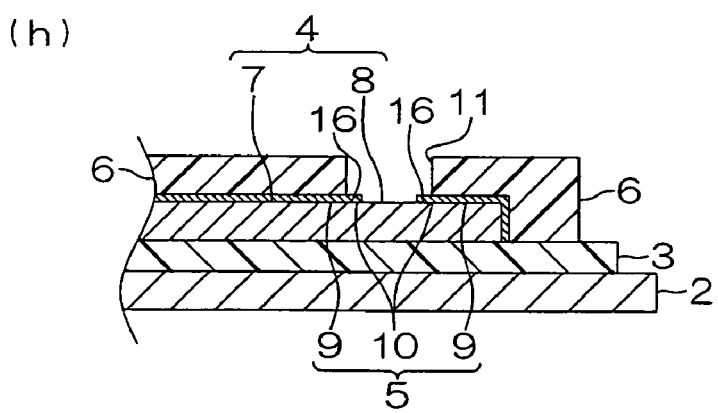
Figure 4:
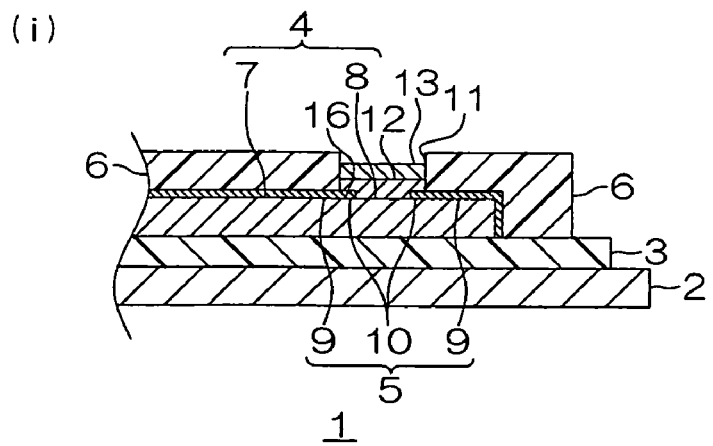
Figure 5:
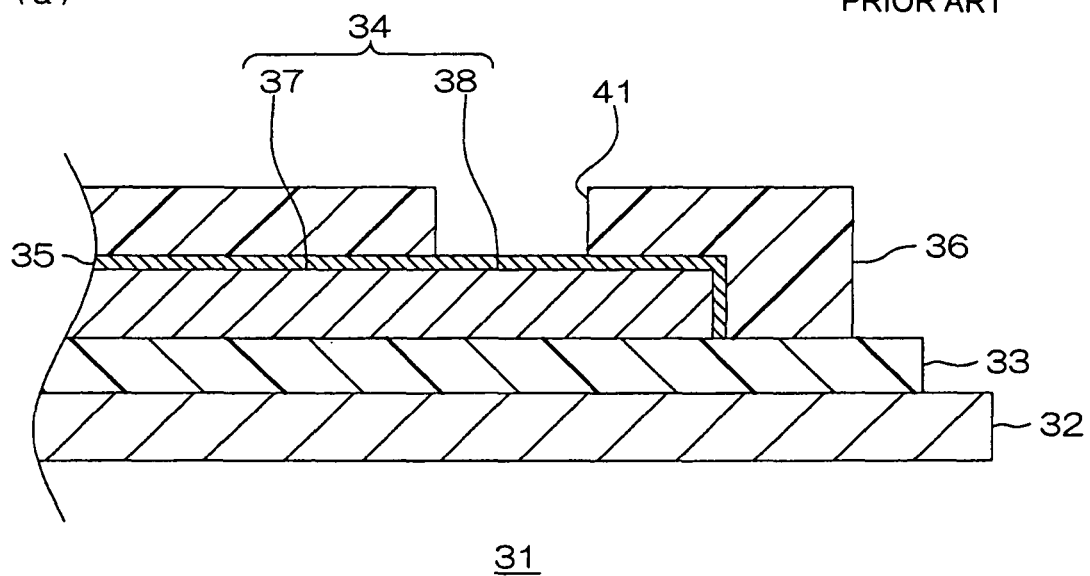
FIG. 5 is a partial cross-sectional view in the longitudinal direction showing the process steps of producing a suspension board with circuit, (a) showing the step of forming a nickel thin film on the surface of a copper conductive layer, and (b) showing the step of etching the nickel thin film formed on the surface of terminal portions.
Figure 5:
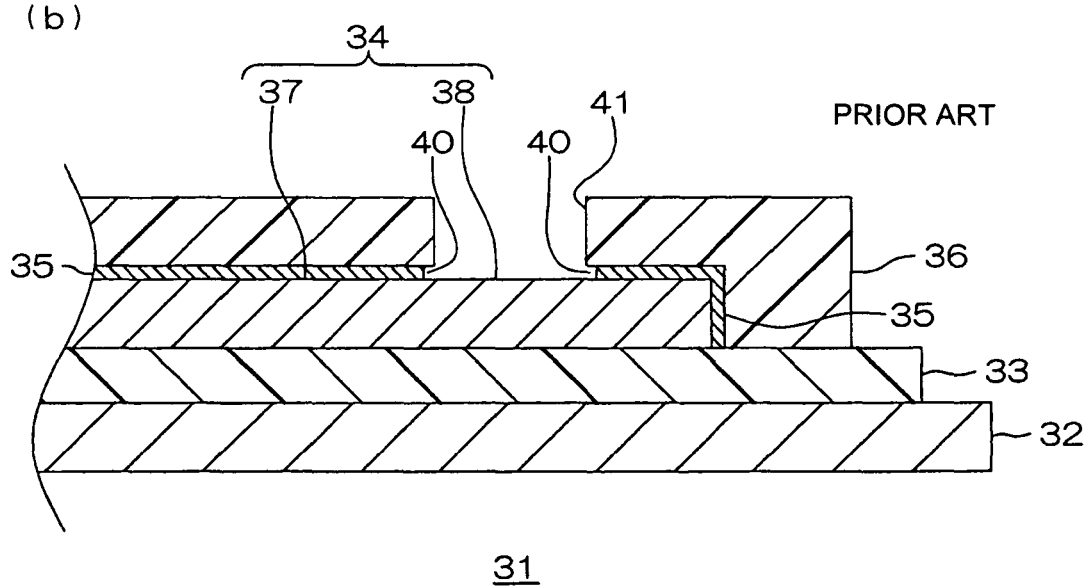

FIGS. 3 and 4 are partial cross-sectional views in the longitudinal direction showing the process steps of producing the wired circuit board shown in FIG. 2.

Next, a description will be given to a producing method of the wired circuit board with reference to FIGS. 3 and 4.

First, as shown in FIG. 3(a), the metal supporting board 2 is prepared in the method.

For the metal supporting board 2, a metal foil made of, e.g., stainless steel, 42-alloy, aluminum, copper-beryllium alloy, or phosphor bronze is used. Preferably, a stainless steel foil is used. The thickness of the metal supporting board 2 is in the range of, e.g., 10 to 50 μm, or preferably 15 to 30 μm.

Next, in the method, as shown in FIG. 3(b), the insulating base layer 3 is formed on the metal supporting board 2. The insulating base layer 3 is formed in the foregoing pattern corresponding to the portion where the conductive pattern 4 is formed.

The insulating base layer 3 is made of a resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. In terms of heat resistance, the insulating base layer 3 is preferably made of a polyimide resin.

The method for forming the insulating base layer 3 in the foregoing pattern is not particularly limited and a known method is used. For example, a varnish of a photosensitive resin (photosensitive polyamic acid resin) is coated on a surface of the metal supporting board 2 and the coated varnish is dried to form a base coating. Subsequently, the base coating is exposed to light via a photomask, heated as necessary, and then developed to form a pattern. Thereafter, the pattern is cured (imidized) by, e.g., heating at a temperature of not less than 250° C. under a reduced pressure.

The thickness of the insulating base layer 3 thus formed is in the range of, e.g., 1 to 35 μm, or preferably 8 to 15 μm.

Next, in the method, as shown in FIG. 3(c), the conductive pattern 4 is formed on the insulating base layer 3. The conductive pattern 4 is formed as a wired circuit pattern integrally including the plurality of wires 7 and the terminal portions 8 each described above.

The conductive pattern 4 is made of a conductive material such as, e.g., copper, nickel, gold, a solder, or an alloy thereof, or preferably made of copper. The conductive pattern 4 is formed on the upper surface of the insulating base layer 3 by a known patterning method such as, e.g., a subtractive method or an additive method. Preferably, the conductive pattern 4 is formed by the additive method as the foregoing wired circuit pattern.

In the subtractive method, a conductive layer is laminated first on the upper surface of the insulating base layer 3 via an adhesive layer as necessary. Then, an etching resist having the same pattern as the wired circuit pattern is formed on the conductive layer and the conductive layer is etched using the etching resist as a resist. Thereafter, the etching resist is removed.

In the additive method, a conductive thin film is formed first on the entire surface of the insulating base layer 3. The conductive thin film is laminated with laminating a chromium thin film and a copper thin film by sputtering, or preferably by chromium sputtering and copper sputtering.

Next, a plating resist is formed in a pattern reverse to the wired circuit pattern on the upper surface of the conductive thin film. Then, the conductive pattern 4 is formed on the upper surface of the conductive thin film exposed from the plating resist as the wired circuit pattern by electrolytic plating. Thereafter, the plating resist and the portion of the conductive thin film where the plating resist is laminated are removed.

The conductive pattern 4 thus formed has a thickness in the range of, e.g., 3 to 20 μm, or preferably 5 to 20 μm.

Next, in the method, as shown in FIG. 3(d), the conductive pattern 4 is covered with the metal thin film 5.

A material for forming the metal thin film 5 can include a metal such as, e.g., nickel, gold, tin, chromium, titanium, zirconium, or an alloy thereof. Preferably, nickel can be listed.

A method for forming the metal thin film 5 can include plating such as, e.g., electrolytic plating or electroless plating, a method for sputtering, e.g., the metal listed above as a target, or the like. Preferably, the metal thin film 5 is formed by electroless plating.

In this manner, the metal thin film 5 is formed on the surface of the conductive pattern 4.

The thickness of the metal thin film 5 thus formed is in the range of, e.g., 0.01 to 0.5 μm, or preferably 0.05 to 0.3 μm.

Next, in the method, as shown in FIG. 3(e), the insulating cover layer 6 is formed on the insulating base layer 3 and on the metal thin film 5 formed on the surface of the conductive pattern 4 in a pattern formed with the cover opening portions 11 exposing the terminal portions 8.

As an insulating material for forming the insulating cover layer 6, the same insulating material as used to form the insulating base layer 3 is used. Preferably, a photosensitive synthetic resin is used, or more preferably photosensitive polyimide is used.

To form the insulating cover layer 6 in the foregoing pattern on the insulating base layer 3 and on the metal thin film 5, e.g., a varnish of a photosensitive resin is uniformly coated first on the surfaces of the metal thin film 5 and the insulating base layer 3 by the same method as described above. Subsequently, the coated varnish is dried in the same manner as described above to form a cover coating.

Then, by the same method described above, the cover coating is exposed to light via a photomask and heated as necessary at a predetermined temperature. Subsequently, by the same method as described above, the portions in which the cover opening portions 11 are formed are removed by development. Thereafter, the cover coating is cured (imidized) by, e.g., heating at a temperature of not less than 250° C. under a reduced pressure to form the insulating cover layer 6.

The thickness of the insulating cover layer 6 thus formed is in the range of, e.g., 1 to 40 μm, or preferably 3 to 5 μm.

Next, in the method, as shown in FIG. 4(f), an etching resist 14 is formed on the insulating cover layer 6 and on the metal thin film 5 on the peripheral end portions 16 of the terminal portions 8 exposed from the cover opening portions 11.

More specifically, the etching resist 14 is formed to be continuously laminated over the surface of the insulating cover layer 6, the inner peripheral surface of the cover opening portions 11, and the upper surface of the metal thin film 5 on the peripheral end portions 16 of the terminal portions 8 exposed from the cover opening portion 11. The etching resist 14 is formed to have the same thickness on the inner peripheral surface of the cover opening portions 11 and on the upper surface of the metal thin film 5 on the peripheral end portions 16 of the terminal portions 8.

The etching resist 14 is formed in the foregoing pattern by a known photo process which performs exposure to light and development using a dry film photoresist or the like.

Next, in the method, as shown in FIG. 4(g), the metal thin film 5 exposed from the etching resist 14 is removed by etching.

The metal thin film 5 is wet-etched using an alkaline solution such as a ferric chloride aqueous solution as an etchant by a dipping method or a spraying method.

By the etching, in the terminal portions 8, the metal thin film 5 exposed from the etching resist 14 formed on the inner peripheral surfaces of the cover opening portions 11 is removed. As a result, the metal thin film 5 on the peripheral end portions 16 of the terminal portions 8, i.e., the exposed portion 10 is formed.

In this manner, the metal thin film 5 is formed in the pattern integrally and continuously including the protecting portions 9 and the exposed portions 10.

Next, as shown in FIG. 4(h), the etching resist 14 is removed. The etching resist 14 is removed by a known etching method or stripping.

Next, as shown in FIG. 4(i), the nickel plating layer 12 and the gold plating layer 13 are successively formed in the cover opening portions 11.

To form the nickel plating layer 12 and the gold plating layer 13, electroless plating and electrolytic plating are used. Preferably, the nickel plating layer 12 and the gold plating layer 13 are successively formed by electrolytic nickel plating and electrolytic gold plating.

The thickness of the nickel plating layer 12 thus formed is in the range of, e.g., 0.03 to 0.5 μm and the thickness of the gold plating layer 13 is in the range of, e.g., 0.5 to 2.5 μm.

Thereafter, in the method, as shown in FIG. 1, the metal supporting board 2 is trimmed into a desired shape by chemical etching, whereby the wired circuit board 1 is obtained.

In the wired circuit board 1, the exposed portions 10 formed continuously from the protecting portions 9 are formed on the peripheral end portions 16 of the terminal portions 8 exposed from the cover opening portions 11. In other words, the protecting portions 9 and the exposed portions 10 are formed continuously between the insulating cover layer 6 and the conductive pattern 4 around the cover opening portions 11. As a result, when the nickel plating layer 12 is plated in the cover opening portions 11, it is possible to prevent a plating solution or the like from entering the space between the insulating cover layer 6 and the conductive pattern 4 around the cover opening portions 11. This prevents corrosion and discoloration of the terminal portions 8 while preventing migration in the conductive pattern 4 by means of the metal thin film 5.

In the foregoing method shown in FIGS. 3 and 4, the metal thin film 5 on the terminal portions 8 (except for the peripheral end portions 16) exposed from the cover opening portions 11 is removed by etching, while the metal thin film 5 on the peripheral end portions 16 of the terminal portions 8 exposed from the cover opening portions 11 is protected with the etching resist 14 (FIGS. 4(f) and (g)). As a result, as shown in FIG. 4(h), the exposed portions 10 formed continuously from the protecting portions 9 can be formed easily and reliably on the peripheral end portions 16 of the terminal portions 8 exposed from the cover opening portions 11. This prevents corrosion and discoloration of the terminal portions 8 while preventing migration in the conductive pattern 4 by means of the metal thin film 5.

In the description given above, the terminal portion 8 is formed of the quadrilateral land. However, the shape thereof is not particularly limited. The terminal portion 8 can be formed in an appropriate shape, such as a round land.

Although the wired circuit board of the present invention has been described above as the wired circuit board 1 including the metal supporting board 2, it is not limited thereto. For example, the wired circuit board of the present invention is widely applicable to other wired circuit board such as, e.g., a flexible wired circuit board which does not include the metal supporting board 2.

EXAMPLE

The present invention is described more specifically by showing an example herein below. However, the present invention is by no means limited to the example.

Example 1

A metal supporting board made of a stainless steel foil having a thickness of 20 μm was prepared (see FIG. 3(a)).

Then, a varnish of a photosensitive polyamic acid resin was uniformly coated on the surface of the metal supporting board using a spin coater. Then, the coated varnish was heated at 90° C. for 15 minutes to form a base coating. Thereafter, the base coating was exposed to light at 700 mJ/cm$^2$ via a photomask, heated at 190° C. for 10 minutes, and then developed using an alkaline developer. Subsequently, the base coating was cured at 385° C. under a reduced pressure of 1.33 Pa to form an insulating base layer made of polyimide in a pattern corresponding to a portion where a conductive pattern was formed on the metal supporting board (see FIG. 3(b)). The thickness of the insulating base layer was 10 μm.

Then, the conductive pattern made of copper and having a thickness of 10 μm was formed by an additive method in a wired circuit pattern integrally including wires and terminal portions on the upper surface of the insulating base layer (see FIG. 3(c)).

Then, the surface of the conductive pattern was covered with a metal thin film made of nickel and having a thickness of 0.15 μm by electroless nickel plating (see FIG. 3(d)).

Then, the varnish of the photosensitive polyamic acid resin mentioned above was uniformly coated on the surfaces of the metal thin film and the insulating base layer using a spin coater and heated at 90° C. for 10 minutes to form a cover coating having a thickness of 7 μm. Thereafter, the cover coating was exposed to light at 700 mJ/cm$^2$ via a photomask, heated at 180° C. for 10 minutes, and then developed using an alkaline developer to be patterned. Subsequently, the cover coating was cured at 385° C. under a reduced pressure of 1.33 Pa to form an insulating cover layer made of polyimide on the insulating base layer and on the metal thin film formed on the surface of the conductive pattern in a pattern formed with cover opening portions exposing the terminal portions (see FIG. 3(e)). The thickness of the insulating cover layer was 5

μm. The cover opening portions were formed in the both longitudinal ends to correspond to the respective terminal portions. The width of the cover opening portions was 65 μm and the length thereof, was 120 μm.

Then, an etching resist was formed on the insulating cover layer and on the metal thin film lying on the peripheral end portions of the terminal portions exposed from the cover opening portions (see FIG. 4(f)). The etching resist was formed to be continuously laminated over the surface of the insulating cover layer, the inner peripheral surface of the cover opening portions, and the upper surface of the metal thin film on the peripheral end portions of the terminal portions exposed from the cover opening portions. The etching resist was formed in the foregoing pattern by exposing a dry film photoresist to light and developing it. The thickness of the etching resist was 20 μm.

Then, the metal thin film exposed from the etching resist was removed by etching using a ferric chloride aqueous solution (see FIG. 4(g)). As a result, the metal thin film was formed in a pattern integrally including protecting portions and exposed portions. The longitudinal width and widthwise width of the exposed portions were each 20 μm.

Then, the etching resist was removed by stripping (see FIG. 4(h)).

Then, a nickel plating layer having a thickness of 0.3 μm was formed in the cover opening portions by electrolytic nickel plating. Subsequently, a gold plating layer having a thickness of 2.5 μm was formed by electrolytic gold plating (see FIG. 4(i)).

Thereafter, the metal supporting board was cut out by chemical etching to form a gimbal and then trimmed, whereby a suspension board with circuit was obtained (see FIG. 1).

(Evaluation)
(Discoloration)

The suspension board with circuit obtained by EXAMPLE 1 was left to stand at 85° C. and 85% RH for 120 hours. However, the discoloration of the insulating cover layer around the terminal portions was not recognized.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
    an insulating base layer;
    a conductive pattern formed on the insulating base layer and including a wire and a terminal portion;
    an insulating cover layer formed on the insulating base layer and having an opening portion to expose the terminal portion;
    a metal thin film including a protecting portion interposed between the wire and the insulating cover layer, and an exposed portion formed continuously from the protecting portion on a peripheral edge portion of the terminal portion exposed from the opening portion: and
    a plating layer formed in the opening portion,
    wherein the exposed portion of the metal thin film is opened to ensure an area where the terminal portion contacts the plating layer.

2. The wired circuit board according to claim 1, wherein the metal thin film is made of nickel.

3. A producing method of a wired circuit board, the method comprising the steps of:
    preparing an insulating base layer;
    forming a conductive pattern including a wire and a terminal portion on the insulating base layer;
    covering the conductive pattern with a metal thin film;
    forming an insulating cover layer having an opening portion to expose the terminal portion on the metal thin film;
    forming an etching resist on the metal thin film on a peripheral edge portion of the terminal portion exposed from the opening portion;
    removing the metal thin film exposed from the etching resist in the terminal portion by etching;
    removing the etching resist; and
    forming a plating layer in the opening portion,
    wherein, in a step of removing the etching resist, the exposed portion of the metal thin film is opened to ensure an area where the terminal portion contacts the plating layer.

4. The producing method of the wired circuit board according to claim 3, wherein the metal thin film is made of nickel.

* * * * *